(12) United States Patent
Pimpinella et al.

(10) Patent No.: US 9,411,096 B2
(45) Date of Patent: Aug. 9, 2016

(54) MULTIMODE OPTICAL FIBER AND METHODS OF USE AND DESIGN THEREOF

(71) Applicant: Panduit Corp., Tinley Park, IL (US)

(72) Inventors: Richard J. Pimpinella, Frankfort, IL (US); Jose M. Castro, Lombard, IL (US); Brett Lane, Hinsdale, IL (US); Bulent Kose, Burr Ridge, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 14/820,315

(22) Filed: Aug. 6, 2015

(65) Prior Publication Data

US 2016/0041332 A1 Feb. 11, 2016

Related U.S. Application Data

(60) Provisional application No. 62/035,082, filed on Aug. 8, 2014.

(51) Int. Cl.
*G02B 6/028* (2006.01)
*G02B 6/02* (2006.01)
*G06F 17/50* (2006.01)
*G06F 17/10* (2006.01)
*H04B 10/2581* (2013.01)

(52) U.S. Cl.
CPC ............ *G02B 6/0288* (2013.01); *G02B 6/0281* (2013.01); *G02B 6/02214* (2013.01); *G06F 17/10* (2013.01); *G06F 17/50* (2013.01); *H04B 10/2581* (2013.01)

(58) Field of Classification Search
CPC .......... G02B 6/03644; G02B 6/03627; G02B 6/0281; G02B 6/0365; G02B 6/03611; G02B 6/028
USPC .................................. 385/123, 124, 125, 126
See application file for complete search history.

(56) References Cited

U.S. PATENT DOCUMENTS

| | | | |
|---|---|---|---|
| 6,438,303 B1 | 8/2002 | Abbott et al. | |
| 9,077,577 B1 * | 7/2015 | Ashrafi | ................. H04L 27/362 |
| 2005/0013570 A1 | 1/2005 | Guan et al. | |
| 2012/0207470 A1 * | 8/2012 | Djordjevic | ............. H04B 10/25 398/44 |

OTHER PUBLICATIONS

Multimode Fibers Optimized for High Speed, Short Reach Interconnects, 33rd European Conference and Exhibition on Optical Communication—ECOC 2007, Sep. 16-20, 2007, Berlin, Germany, Lingle R JNR et al.

* cited by examiner

*Primary Examiner* — Jennifer Doan
(74) *Attorney, Agent, or Firm* — Christopher S. Clancy; James H. Williams; Yuri Astvatsaturov

(57) ABSTRACT

The present invention relates generally to multimode optical fibers (MMFs) and methods for optimizing said MMFs for transmission for at least two optical wavelengths. In an embodiment, the present invention is a multimode optical fiber optimized for multi-wavelength transmission in communication systems utilizing VCSEL transceivers, where the MMF has a bandwidth designed to maximize channel reach for multiple wavelengths, and/or where the MMF minimizes for wavelength dependent optical power penalties at one or more wavelength.

13 Claims, 6 Drawing Sheets a) L-MMF b) R-MMF

MULTIMODE OPTICAL FIBER AND METHODS OF USE AND DESIGN THEREOF

FIELD OF INVENTION

This application claims the benefit of U.S. Provisional Patent Application No. 62/035,082 filed on Aug. 8, 2014, which is incorporated herein by reference in its entirety.

FIELD OF INVENTION

The present invention relates generally to multimode optical fibers (MMFs) and methods for optimizing said MMFs for transmission for at least two optical wavelengths. Said MMFs can be designed to compensate for the modal and chromatic dispersion interaction caused by the spatial spectral coupling of VCSEL modes to fiber modes. Optionally, the inventive MMFs have a zero dispersion wavelength shifted to the region of operating wavelengths.

BACKGROUND

A common method for achieving high data rate optical communications is to transmit multiple data streams over a single optical fiber using discrete lasers operating at different wavelengths. This data transmission method is known as wavelength division multiplexing (WDM). Two International Telecommunication Union (ITU) standards ITU-T G.694.1 and ITU-T G.694.2 define the allowable wavelengths and spacing for Dense-WDM (DWDM) and Coarse-WDM (CWDM) channel grids, respectively. In these standards, the channel spacing can be as small as 12.5 GHz (0.1 nm) utilizing distributed feedback (DFB) lasers with spectral widths on the order of 2 MHz (0.000002 nm). WDM is widely used in high-speed long reach (i.e. transport) telecommunications networks utilizing single-mode fiber (SMF).

For applications that do not require long reach, such as those within the enterprise or datacenter, high-speed optical communication systems based upon Vertical Cavity Surface Emitting Lasers (VCSELs) operating near 850 nm utilizing multimode fiber (MMF) are cost effective and widely used. Recently, the demands of increased throughput by these applications have been achieved primarily by incremental increases in VCSEL modulation rates, for example from 1 Gbps to 10 Gbps as defined in the Institute of Electrical and Electronics Engineers (IEEE) Ethernet standards IEEE 802.3, and by increasing the number of parallel lanes, for example from 1 lane comprising a single VCSEL transmitter operating at 10 Gbps to 4 lanes comprising four VCSELs operating at 10 Gbps each to provide an aggregate data rate of 40 Gbps.

Another attractive technique to provide increased data rates for these applications, that would circumvent the need for additional fiber optic channels including optical connectors and MMF, is WDM. However, in contrast to single-mode WDM systems where there may be a large number of channels, the number of channels in a MMF system may be limited due to the fact that cost effective VCSELs have large spectral widths and that the modal bandwidth and material dispersion of traditional laser-optimized MMF, such as that compliant to TIA-492-AAAC (OM3) and TIA-492-AAAD (OM4), has a strong wavelength dependence that would cause the channels to experience differing amounts of distortion and achievable reaches. Consequently, traditional MMF is not ideally suited for broadband WDM application.

Hence, there is a need for a MMF optimized for WDM applications that can provide greater channel reach compared to standard laser-optimized OM3 and OM4 fiber.

SUMMARY

The increased reach may be realized by modifying the MMF core refractive index profile such that the peak wavelength balances the modal and chromatic dispersion effects with other power penalties at the transmission wavelengths for optimized reaches. The optimization may be achieved by modeling the refractive index profile, simulating the combined modal-chromatic bandwidth, calculating channel reach at the transmission wavelengths and selecting an index profile that essentially equalizes the channel reaches for the longest and shortest wavelengths. MMF performance may be further improved by reducing the material dispersion of the fiber. In this disclosure we describe improved MMFs for use in broadband, multi-wavelength optical communication channels, and methods for design and/or manufacture of such MMFs.

Accordingly, in an embodiment, the present invention is a multimode optical fiber optimized for multi-wavelength transmission in communication systems utilizing VCSEL transceivers, where the MMF has a bandwidth designed to maximize channel reach for multiple wavelengths, and/or where the MMF minimizes for wavelength dependent optical power penalties at one or more wavelength.

In another embodiment, the present invention is an MMF optimized for WDM applications utilizing multi-wavelength transmission within the 825 nm to 1300 nm design window.

In another embodiment, the present invention is a multimode optical fiber and method for specifying said optical fiber that maximizes channel performance and reach over multiple wavelengths, applicable to WDM applications. A MMF according to an embodiment of the present invention has an α-profile optimized for optical communication systems utilizing at least two wavelengths and compensates for the interaction of modal and chromatic dispersion resulting from the spatial-spectral coupling of VCSEL modes to MMF modes. In addition, a fiber in accordance with the embodiment may have a specified minimum EMB as measured using standard test methods at a nominal wavelength of 850 nm±10 nm, and may satisfy a second metric which specifies the relative mode group delays as measured in the DMD radial waveform profile.

In another embodiment of the present invention, for a given set of input parameters, an $\alpha_{opt}$ is calculated for each transmission wavelength. This can be achieved by employing equation (5). Next, an initial α is selected essentially midway between the two $\alpha_{opt}$ values calculated for the operational wavelengths ($\lambda_1$ & $\lambda_2$). Given these parameters, one can simulate the DMD radial waveform plot for each wavelength and the modal bandwidth can be calculated. To accommodate for modal-chromatic dispersion, the temporal centroid of each MG impulse in the DMD waveforms are then temporally corrected for chromatic effects and the modal-chromatic bandwidth is calculated. Using the modal-chromatic bandwidths for each wavelength ($\lambda_1$ & $\lambda_2$), the maximum channel reaches ($R_1$ & $R_2$) are then calculated using conventional channel link models. Typically, in standard MMF the two maximum reaches for the two operational wavelengths will be different, where the maximum channel reach is defined to be the shorter of the two reaches. If $R_1 > R_2$ the α-parameter must be increased in order to decrease $R_1$ and increase $R_2$. Increasing α, has the effect of shifting the peak optimized wavelength to shorter wavelength. Decreasing α, shifts the peak optimized wavelength to longer wavelength, as required if $R_1 < R_2$. The above process is repeated until the condition for maximum reach is obtained when $R_1 = R_2$ resulting in a MMF optimized for the multiple operational wavelengths.

In another embodiment, the present invention is a method for manufacturing a multimode optical fiber (MMF) optimized for operation within a plurality of operating wavelengths, the MMF having a core with a refractive index profile defined by $$n(r) = n_1 \sqrt{1 - 2\Delta \left(\frac{r}{a}\right)^\alpha}$$

where: $n_1$ is a refractive index at a center of the core, r is a radius of the core, $\alpha$ is a parameter defining a shape of the refractive index profile, $\Delta = (n_1 - n_2)/n_1$, and $n_1$ is a refractive index of the core at r=a. The method comprised the steps of: (a) obtaining at least one parameter associated with at least one of a transceiver and the MMF; (b) for each of the plurality of operating wavelengths, determining an $\alpha_{opt}$ value using the at least one parameter, where for each of the plurality of operating wavelengths the respective $\alpha_{opt}$ value minimizes a group delay of the MMF when the $\alpha$ is set equal to the $\alpha_{opt}$; (c) based on the plurality of $\alpha_{opt}$ values, selecting a single $\alpha_{temp}$ value; (d) for each of the plurality of operating wavelengths, computing a differential mode delay (DMD) plot and a relative group delay $t_g$ by using the single $\alpha_{temp}$ value; (e) for each of the plurality of operating wavelengths, computing a modal-chromatic bandwidth by using the respective DMD plot; (f) for each of the plurality of operating wavelengths, calculating a maximum channel reach value by using the respective modal-chromatic bandwidth; (g) adjusting the single $\alpha_{temp}$ value when the maximum channel reach values are not equal and repeating steps (d)-(g); (h) setting the $\alpha$ to the adjusted single $\alpha_{temp}$ value; and (j) producing the MMF.

In yet another embodiment, the present invention is a method for manufacturing a multimode optical fiber (MMF) optimized for operation between a first operating wavelength and a second operating wavelength, the MMF having a core with a refractive index profile defined by $$n(r) = n_1 \sqrt{1 - 2\Delta \left(\frac{r}{a}\right)^\alpha}$$

where $n_1$ is a refractive index at a center of the core, r is a radius of the core, $\alpha$ is a parameter defining a shape of the refractive index profile, $\Delta = (n_1 - n_2)/n_1$, and $n_1$ is a refractive index of the core at r=a. The method comprises the steps of (a) obtaining at least one parameter associated with at least one of a transceiver and the MMF; (b) for the first operating wavelength, determining an $\alpha_{opt1}$ value using the at least one parameter, where for the first operating wavelength the $\alpha_{opt1}$ value minimizes a group delay of the MMF when the $\alpha$ is set equal to the $\alpha_{opt1}$; (c) for the second operating wavelength, determining an $\alpha_{opt2}$ value using the at least one parameter, where for the second operating wavelength the $\alpha_{opt2}$ value minimizes the group delay of the MMF when the $\alpha$ is set equal to the $\alpha_{opt2}$; (d) based on the $\alpha_{opt1}$ value and the $\alpha_{opt2}$ value, selecting an $\alpha_{temp}$ value; (e) for each of the first and second operating wavelengths, computing a differential mode delay (DMD) plot and a relative group delay $t_g$ by using the $\alpha_{temp}$ value; (f) for each of the first and second operating wavelengths, computing a modal-chromatic bandwidth by using the respective DMD plot; (g) for each of the first and second operating wavelengths, calculating a maximum channel reach value by using the respective modal-chromatic bandwidth, where for the first operating wavelength the respective maximum channel reach value is R1 and for the second operating wavelength the respective maximum channel reach value is R2; (h) adjusting the $\alpha_{temp}$ value when $R1 \neq R2$ such that $\alpha_{temp} = \alpha_{temp} \pm x$, and repeating steps (e)-(h); (i) setting the $\alpha$ to the $\alpha_{temp}$ value when $R1 \neq R2$; and (j) producing the MMF.

In yet another embodiment, the present invention is a method for manufacturing a multimode optical fiber (MMF) optimized for operation between a first operating wavelength $\lambda_1$ and a second operating wavelength $\lambda_2$, the MMF having a core with a refractive index profile with an $\alpha$-parameter. The method comprises the steps of: (a) obtaining at least one parameter associated with at least one of a transceiver and the MMF; (b) for the $\lambda_1$, determining an $\alpha_{opt1}$ value using the at least one parameter, where for the $\lambda_1$ the $\alpha_{opt1}$ value minimizes a group delay of the MMF when the $\alpha_{opt1}$ used as the $\alpha$-parameter of the refractive index profile; (c) for the $\lambda_2$, determining an $\alpha_{opt2}$ value using the at least one parameter, where for the $\lambda_2$ the $\alpha_{opt2}$ value minimizes the group delay of the MMF when the $\alpha_{opt2}$ used as the $\alpha$-parameter of the refractive index profile; (d) based on the $\alpha_{opt1}$ value and the $\alpha_{opt2}$ value, selecting an $\alpha_{temp}$ value; (e) for each of the $\lambda_1$ and the $\lambda_2$, computing a differential mode delay (DMD) plot and an effective modal bandwidth by using the $\alpha_{temp}$ value; (f) for each of the DMD plots, correcting a temporal centroid of each mode-group impulse in the respective DMD plot to account for modal-chromatic dispersion; (g) for each of the $\lambda_1$ and the $\lambda_2$, calculating a modal-chromatic bandwidth; (h) for the $\lambda_1$, using the respective modal-chromatic bandwidth to calculate a maximum channel reach R1; (i) for the $\lambda_2$, using the respective modal-chromatic bandwidth to calculate a maximum channel reach R2; (j) adjusting the $\alpha_{temp}$ value when $R1 \neq R2$ such that $\alpha_{temp} = \alpha_{temp} \pm x$, and repeating steps (e)-(j); and (k) producing the MMF with the refractive index profile defined by the $\alpha$-parameter being equal to $\alpha_{temp}$ value when $R1 = R2$.

These and other features, aspects, and advantages of the present invention will become better understood with reference to the following drawings, description, and any claims that may follow.

DETAILED DESCRIPTION

Figure 1:
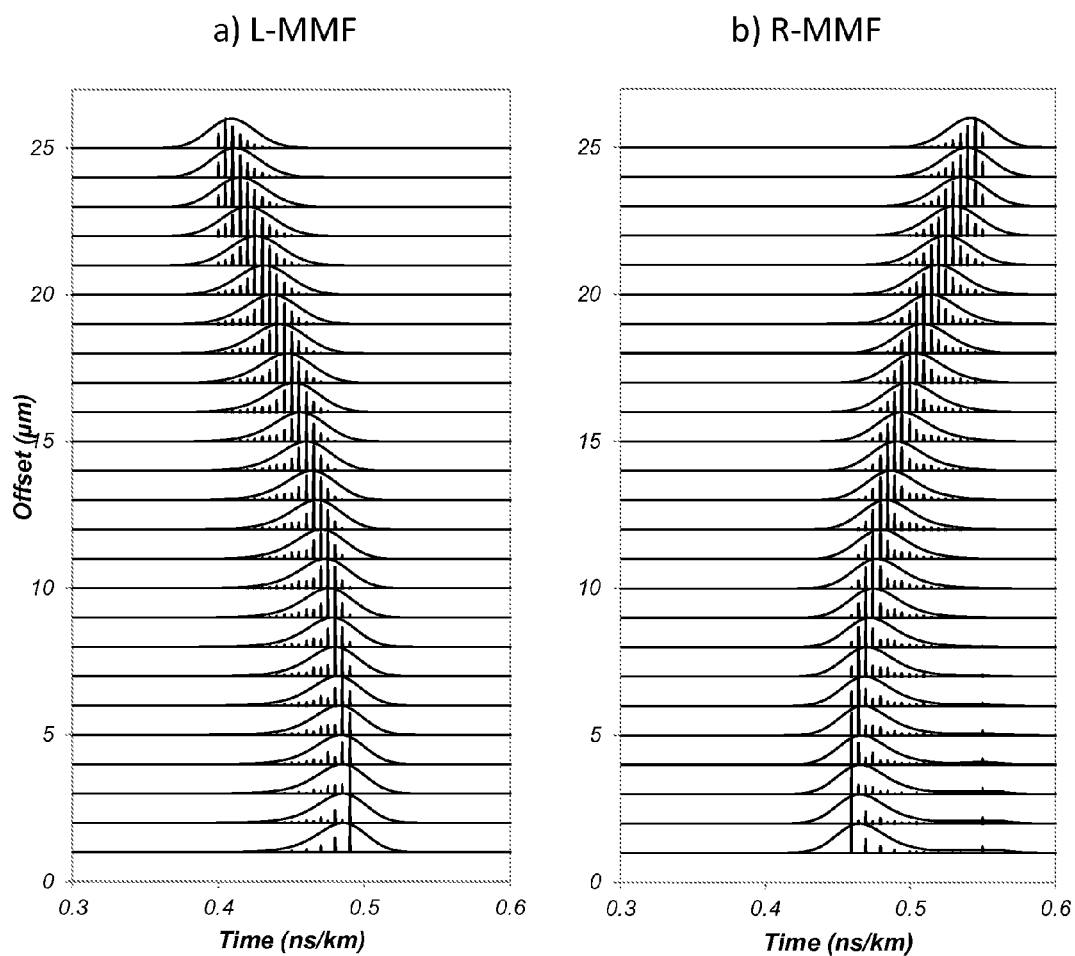
FIG. 1 is a plot of the simulated DMD pulse waveforms and the impulse response as a function of time for 25 radial offset launches and arrival time.

Due to the complex nature of contemporary optical communication systems comprising many optical and electrical components, it is common for designers to employ simulations or models of the channel to gain insight into performance of the entire channel as the performance attributes of a constituent component or components is varied. One example of this is the utilization of a Microsoft® Excel® based spreadsheet developed by the IEEE (Institute of Electrical and Electronics Engineers) 802.3 Ethernet standards body to simulate the performance of an optical physical layer for a channel operating at 10 Gbps using an MMF as the signal transmission medium (i.e. 10 GBASE-SR). This link model spreadsheet, and other more sophisticated channel simulation tools such as OptSim™ of Synopsys Optical Solutions Group, contain a comprehensive list of quantitative component performance attributes and use them to simulate the performance of the entire channel. For example, the effects of the laser transmitter rise-time, a component attribute, on the BER (bit error rate) of the channel may be simulated with these models.

One of the components influencing the performance of optical system utilizing an MMF as the transmission medium is the bandwidth of the fiber. As an illustration, using the published version of the IEEE 10 Gigabit link model (version 3.1.16a, 850S2000 worksheet), which is incorporated herein by reference in its entirety, the distance or reach at which the channel has zero margin and a BER of 1×10$^{-12}$ varies from 300 m for an MMF with an effective modal bandwidth (EMB) of 2000 MHz·km to only 166 m for an MMF with an EMB of 1000 MHz·km. Therefore, since it may be desirable to design a high performance optical communication system and the performance of the system may be dependent upon the MMF, it may be desirable to design a high performance MMF including attributes of low optical loss and/or high bandwidth per unit length and to use a channel model to appraise the impact of the design choices upon the final channel performance.

Multimode fiber used in high-speed local area network and data storage applications is typically optimized for single wavelength operation near 850 nm, has a core diameter of 50 μm, and has a modal bandwidth ranging from 2000 MHz·km to 4700 MHz·km or more. The refractive index profile of such an MMF is chosen to maximize the modal bandwidth or equivalently to minimize modal dispersion which is the spread in mode group delays. The optimal refractive index profile depends on the exact dispersion characteristics of the doped silica comprising the fiber, and can be very close to a parabola profile.

The propagating modes in a MMF can be divided into degenerate mode groups (MGs), where the modes in each MG have nearly equivalent propagation constants. For an MMF having a core diameter of 50 μm and for an operating wavelength of 850 nm there are approximately 380 discrete fiber modes divided into 19 mode groups.

A pulse launched into a given mode propagates at a group velocity of a mode and spreads out in time as a result of chromatic dispersion. Chromatic dispersion is a result of the difference in propagation speeds of the spectral components of the transmitted signal. In long-haul or metropolitan area networks using SMF (single mode fiber) and narrowband lasers, chromatic dispersion penalties can become significant typically after propagating several kilometers. However in VCSEL-MMF based channels, where the RMS spectral width of the VCSELs can be as broad as, for example, 0.65 nm, a significant chromatic dispersion penalty can limit the lengths to considerably less than 400 m. In some applications, chromatic dispersion is the primary limiting penalty reducing channel reaches to less than 150 m.

When several mode groups are excited and propagate, the pulse broadens due to the difference in mode group velocities transporting the optical signal (modal dispersion). These differences are a consequence of imperfections in the refractive index profile and/or differences between the ideal and actual operating wavelength(s) of the transmitter.

When different mode groups comprise different spectral components, the pulse also broadens due to a combined modal-chromatic dispersion interaction. The variation in mode group spectra is herein referred to as the Mode Spectral Bias (MSB). Modal and chromatic dispersion effects increase the channel's Inter-symbol Interference (ISI) power penalty thereby degrading channel performance.

To minimize modal dispersion, the refractive index profile must equalize the mode group delays. The parameter that describes the refractive index profile is the alpha parameter (α parameter), and the index profile is often referred to as the α-profile. The refractive index profile of the core is described by a function given by, $$n(r) = n_1 \sqrt{1 - 2\Delta\left(\frac{r}{a}\right)^\alpha} \quad (1)$$

where $\Delta \approx (n_1-n_2)/n_1$, $n_1$ is the refractive index on the central axis of the fiber, $n_2$ is the refractive index at the core/cladding interface, r is the radial position inside the fiber core relative to its central axis, a is the core radius, and α is the exponent parameter which takes a value of ~2 for fibers designed to support operation near 850 nm.

The propagation constant for modes propagating in this type of graded index MMF is given by, $$\beta_g(v) = n_1 k_o \sqrt{1 - 2\Delta\left(\frac{v_g}{v_T}\right)^{\alpha/(\alpha+2)}} \quad (2)$$

where g is the mode group (MG) index, (a mode group comprises those modes that have nearly equal propagation constants), $v_g$ is the number of modes inside the MG, which have a propagation constant larger than $\beta_g(v)$, $v_T$ is the total number of modes, $k_0 = 2\pi/\lambda$ and λ is the optical source wavelength. From equation (2) the length normalized group delay can be obtained from, $$t_g = \left(\frac{1}{c}\right)\frac{d\beta_g}{dk_0} \quad (3)$$

where c is the speed of light in the vacuum.

A simplified expression for $t_g$ as a function of the wavelength is obtained by expanding (2) into a binomial series and taking the derivative. The significant terms are shown in the following equation, $$t_g(\lambda) = \frac{N_1(\lambda)}{c} \left[ 1 + \Delta\left(\frac{\alpha - \alpha_{opt}(\lambda)}{\alpha + 2}\right) \cdot \left(\frac{v_g}{v_T}\right)^{\alpha/(\alpha+2)} + \ldots \right] \quad (4)$$

where $N_1$ is the group refractive index of the core material at r=0 and, $$\alpha_{opt}(\lambda) = 2 - \frac{2n_1}{N_1} \frac{\lambda}{\Delta} \frac{d\Delta}{d\lambda} \quad (5)$$

is the optimum alpha value that minimizes group delay at a single operational wavelength $\lambda$.

Equation (4) indicates that when $(\alpha-\alpha_{opt})>0$ (positive slope condition), the group delay increases as the group index increases. For cases where $(\alpha-\alpha_{opt})<0$ (negative slope condition) the group delay decreases as the group index increases. Therefore, depending on the sign of the slope, higher-order MGs have faster or slower group velocities compared to lower-order MGs. Currently the characterization of MMF and the application models that calculate the maximum channel reach accommodate for the magnitude of this slope. However, the sign of the slope has significant effect on channel performance when optical sources with multiple-transverse modes are utilized.

Modal bandwidth of a laser-optimized MMF is characterized by measuring its differential mode delay (DMD) or effective modal bandwidth (EMB); metrics standardized within domestic and international standards organizations. The DMD test method describes a procedure for launching a temporally short and spectrally narrow pulse (reference pulse) from a SMF into the core of a MMF at several radial offsets. After propagating through the MMF under test, the pulses are received by a fast photodetector which captures the MMF core power. The DMD is computed as the relative difference in mode group delay in the received. The EMB is estimated by the Fourier domain deconvolution of the input pulse from a weighted sum of the received signals for each radial offset launch. The set of weight values utilized in the computation belong to a set of ten representative VCSELs.

An important characteristic of a channel comprising VCSEL transceivers and an MMF is its transfer function and impulse response, which is determined by the characteristics of the fiber, source, and optical coupling. Due to their small cavity thickness, VCSELs mostly operate in the single longitudinal mode regime. However, as a result of their large active cavity width multiple transverse modes are exited broadening the VCSEL's spectral width.

Consequently, when a pulse of light from a VCSEL is launched into an MMF, the impulse response of the fiber is a superposition of pulses that depends on both wavelength and mode spectra coupling effects. Due to the mode spectral bias there is a chromatic dispersion associated with the modal delays between the higher-order and low-order modes groups that spread in time depending on the mode group spectral variation.

The VCSEL spectrum can be represented by $$P^{VCSEL}(\lambda) = \sum_{i=1}^{N_{VM}} P_i \delta(\lambda - \lambda_i) \quad (6)$$

where $P_i$ represents the long term average power of the $i^{th}$ VCSEL mode, $N_{VM}$ is the number of VCSEL transversal modes, and $\lambda_i$ the wavelength of each mode.

The propagating mode field profiles of an MMF can be determined using numerical analysis. The coupling coefficient for the MMF and VCSEL modes, $C_{gi}$, are obtained from the square sum of the normalized overlap integral of each $i^{th}$ VCSEL mode and all the fiber modes belonging to the $g^{th}$ MG.

The $C_{gi}$ matrix can be used to obtain the spectra of each MMF mode group, $PG_g$, as follows, $$PG_g(\lambda) = \sum_{i=1}^{N_{VM}} C_{gi} P_i \delta(\lambda - \lambda_i) \quad (7)$$

The symbol $<>$ is utilized to represent a weighted average operator and it is applied here to obtain the center wavelengths of each MG given by, $$\bar{\lambda}_g = <\lambda, PG_g> = \frac{\sum_k PG_g(\lambda_k)\lambda_k}{\sum_k PG_g(\lambda_k)} \quad (8)$$

Due to the broad range of VCSEL center wavelengths it is useful to describe the MSB, or in general, the change in the MG spectra as, $$\Delta\lambda_g = \bar{\lambda}_c - \bar{\lambda}_g \quad (9)$$

where, the center wavelength of the VCSEL is given by $\bar{\lambda}_c = <\lambda, P^{VCSEL}>$.

Generally, modal dispersion theory does not include the radial variation in optical spectrum; nor does it account for the relative variation in propagation speed due to chromatic dispersion. These phenomena, neglected in the standard models for link performance and bandwidth estimation, can significantly affects the total bandwidth of a link. Traditionally it was assumed that the spectrum of all modes is identical, or that it does not exhibit any bias towards certain spectral regions. Therefore, assuming negligible polarization dispersion, pulse broadening is only due to modal and chromatic dispersion acting independently of each other.

The modal dispersion is a result of the different propagation speed of each of the modes. When the pulse recombines at the receiver, all the discrete pulses travelling in different modes are not aligned and consequently the total pulse broadens. The transfer function due to the VCSEL's spatial spectral coupling is given by $$H(f) = \sum_{g=1}^{N_g} e^{-\alpha_g} \int_{-\infty}^{\infty} PG_g(\lambda - \bar{\lambda}_g) e^{-iw\tau_g(\lambda)L} d\lambda \quad (10)$$

where, $\alpha_g$ represents the fiber attenuation of each mode group, $\tau_g$ is the group delay described by equation (4), L is the length of the link and w the circular frequency. The assumptions for equation (10) are that the detector aperture is large enough to capture all modes transmitted in the fiber, there is negligible mode coupling among MGs, and that the bandwidth of the modulation source is smaller than the spectral width of the source modes. A discrete sum is used instead of the integral since the mode-continuum approximation is not necessarily satisfied in VCSEL-MMF links.

Equation (10) is sufficient to compute the 3 dB modal-chromatic bandwidth using the MG spectra and group delays described earlier. However, it is better to describe the interaction of chromatic and modal dispersion by converting equation (10) to the temporal domain to obtain the impulse response of the VCSEL-MMF.

To a first order approximation equation (4) can be modified as $$t_g(\lambda) = t_g(\bar{\lambda}_c) + D(\bar{\lambda}_c)[\bar{\lambda}_g - \bar{\lambda}_c] + D(\bar{\lambda}_c)[\lambda - \bar{\lambda}_g] \tag{11}$$

where, $D(\lambda c)$ is the chromatic dispersion parameter at the operational wavelength. Using equation (11) in equation (10), $$H(f) = \sum_{g=1}^{N_g} e^{-\alpha_g} e^{-iw[\tau_g(\bar{\lambda}_c) + D(\bar{\lambda}_g - \bar{\lambda}_c)]L} \int_{-\infty}^{\infty} PG_g(\lambda - \bar{\lambda}_g) e^{-iw(D(\lambda - \bar{\lambda}_g))L} d\lambda \tag{12}$$

The impulse response of the channel is obtained from the Fourier transform of equation (12) as follows, $$h(t) = \sum_{g=1}^{N_g} e^{-\alpha_g L} (PG'_g(t - \Delta_g)) \tag{13}$$

where $PG'_g(t)$ is the impulse response for each mode group given by, $$PG'_g(t) = (DL) P_g\left(\frac{t}{DL}\right) \tag{14}$$

and the term, $\Delta_g$ represents the temporal centroid of each MG impulse given by, $$\Delta_g = \tau_g(\bar{\lambda}_c) - D\Delta\bar{\lambda}_g \tag{15}$$

Equation (15) has two components: modal delays and chromatic delays described in equations (4) and (9) respectively. Maximizing bandwidth requires minimizing the standard deviation of h(t) in equation (13). One method to achieve this is to reduce the misalignment of the impulse response centroids, which is equivalent of minimizing the standard deviation of $\Delta_g$.

The models described above indicate that $\Delta\lambda_g$ and $\Delta\lambda_r$ have a positive slope since shorter VCSELs wavelengths preferably couple to higher MGs. Since D is known to be negative (for the operating wavelength around 850 nm) fibers with negative $t_g$ slope, i.e., Left-shifted MMF (L-MMF) can reduce the standard deviation of $\Delta_g$ and increase the bandwidth of the channel. For Right-shifted MMF (R-MMF) the chromatic and temporal dispersion increase since both $\tau_g(\lambda_c)$ and $-D\Delta\bar{\lambda}_g$ have positive slopes. In FIG. 1 shows, the resultant DMD profiles when including the modal-chromatic dispersion interaction in the L- and R-shifted DMD profiles shown in FIG. 1. Due to the modal-chromatic interaction the DMD for the L-MMF decreases (i.e., radial waveform are more aligned) resulting in an increase in total bandwidth, whereas in the R-MMF the DMD increases degrade the fiber bandwidth.

Another important factor shown in previous equations that can be used for further increase of the bandwidth of a multimode optical fiber is $D(\lambda)$ which is known to depend on the inherent change in refractive index as a function of wavelength, which causes different wavelengths to travel at different speeds through the fiber. This phenomenon is known as material dispersion where, $$\frac{dn}{d\lambda} \neq 0 \tag{16}$$

In optical fibers the combination of material dispersion and waveguide dispersion is the chromatic dispersion. In multimode fiber however, the effect of waveguide dispersion is relative small compared with the material dispersion. Therefore for the purposes of this specification, terms "material dispersion" and "chromatic dispersion" are used interchangeably. We can compute the chromatic dispersion of a fiber by numerically fitting pulse delay data as a function of wavelength using the following least-mean-square-error criterion:

$$\tau(\lambda) = A + B\lambda^2 + C\lambda^{-2} \tag{17}$$

where $\tau(\lambda)$ is the spectral group delay as a function of wavelength, and A, B, & C are fitted parameters.

The chromatic dispersion $D(\lambda)$ is defined as:

$$D(\lambda) \equiv \frac{d\tau}{d\lambda} \tag{18}$$

Combining equations (17) and (18) results in:

$$D(\lambda) = \frac{d}{d\lambda}\tau(\lambda) = 2(B\lambda - C\lambda^{-3}) \tag{19}$$

Using the fitted parameters B & C it is useful to compute the wavelength for which the chromatic dispersion is zero. This is called the "zero-dispersion" wavelength (ZDW), $\lambda_0$. From equation (19), one obtains:

$$\lambda_0 = \left(\frac{C}{B}\right)^{1/4} \tag{20}$$

Typical multimode fibers have a zero dispersion wavelength in the range, $$1295 \text{ nm} \leq \lambda_0 \leq 1320 \text{ nm} \tag{21}$$

From equation (21) it is possible to solve for the parameter C in terms of $\lambda_0$, $$C = B\lambda_0^4 \tag{22}$$

An alternative method to compute the chromatic dispersion uses the Sellmeier coefficients, defined here as $a_i$ and $b_i$, and the Sellmeier equation (23). This equation is used in the field of optical waveguides/fibers to empirically describe the wavelength dependent refractive index from which one can calculate the mode group delays and dispersion parameters of the waveguide or fiber.

Using this method, the refractive index are computed using:

$$n^2(\lambda) = 1 + \sum_{i=1}^{3} \frac{a_i \lambda^2}{\lambda^2 - b_i^2} \quad (23)$$

where $a_i$ and $b_i$ are the Sellmeier coefficients, and the chromatic dispersion parameters is given by:

$$D(\lambda) = -\frac{\lambda}{c}\frac{d^2 n}{d\lambda^2} \quad (24)$$

Currently, the ZDW of laser optimized OM3 and OM4 fiber is approximately in the 1310 nm wavelength window. In the shorter wavelength windows the chromatic dispersion can be significant. For communication systems employing high modal bandwidth fibers (e.g., EMB>4700 MHz-km), the chromatic dispersion penalty of this fiber can be large and often dominates other bandwidth limiting factors. Therefore it can be advantageous to modify the fiber core material system to reduce chromatic dispersion to optimize the fiber for short wavelength transmission.

Figure 2:
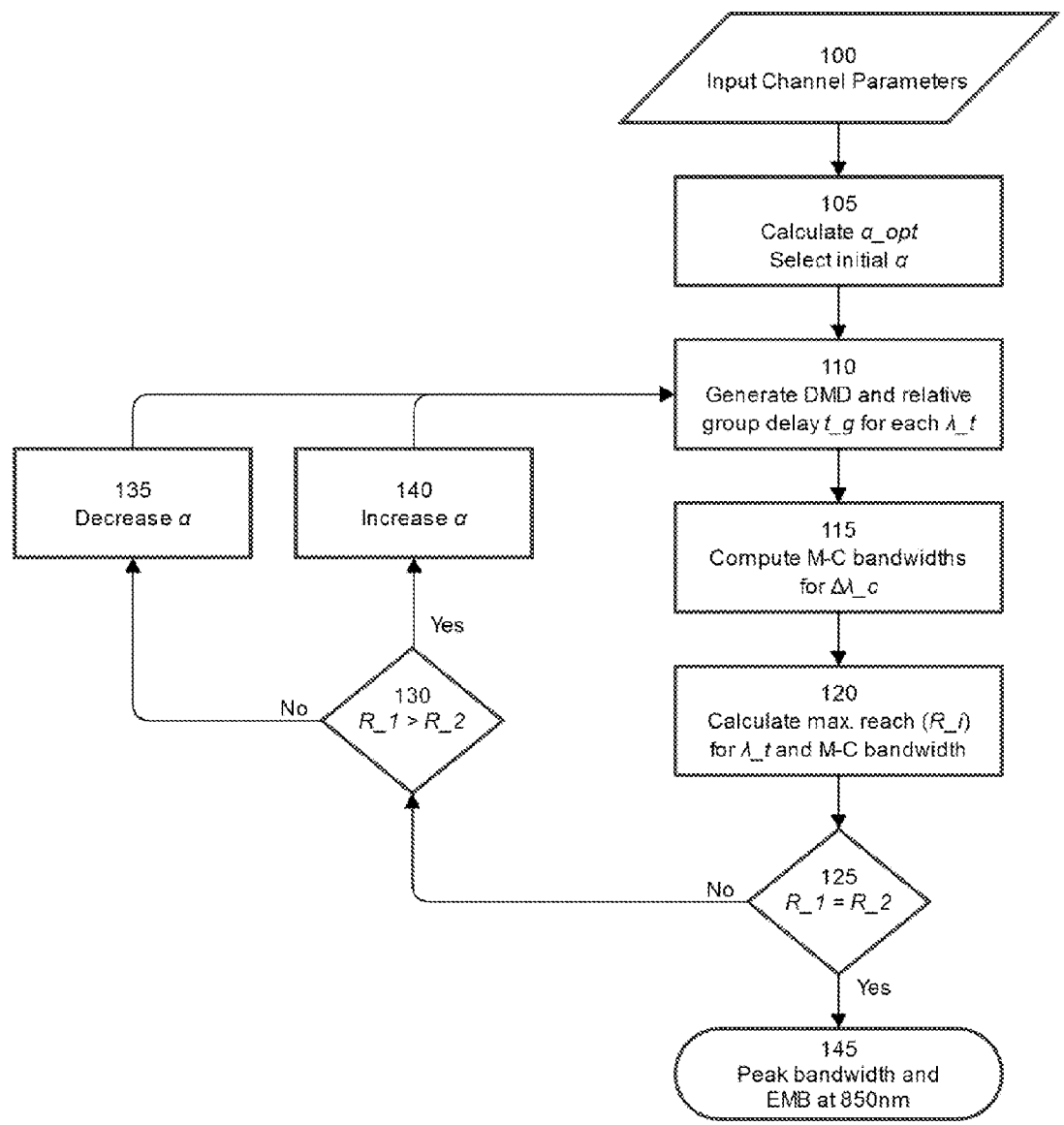
FIG. 2 is a flow chart of the method suitable for designing a fiber according to an embodiment of the present invention.

One way to design an improved fiber is to perform an optimization algorithm during the design/manufacture step of the fiber. An exemplary method, according to an embodiment of the present invention, of designing an improved fiber which takes into account the optimization algorithm is shown in the flow chart illustrated in FIG. 2. The optimization of the method described in this embodiment can depend on the fiber's source characteristics, mode-spectral coupling, and transmission wavelengths. This information is obtained in step 100 where the channel parameters for the transceiver and fiber system are inputted. Example of such parameters include, but are not limited to, the range of operative wavelengths ($\lambda_1$, $\lambda_2$), core and cladding dimensions, fiber materials and dopants, transmission data rate, maximum specified bit error rate, chromatic dispersion, and other signal integrity properties such as rise-time, relative intensity noise, and jitter among others.

Once all input parameters have been collected in step 100, the next step 105 is to use the fiber dimensions and material properties to compute the alpha optimum function for the two wavelengths, $\lambda_1$, $\lambda_2$, or for all wavelength within this range. For this example, the alpha profiles are computed for wavelengths within the range ($\lambda_1$=830 nm, $\lambda_2$=920 nm).

For a MMF having a core radius of 25 microns doped with $GeO_2$ 4.5 mol %, and a cladding doped with F 2% wt, the Sellmeier coefficients for the concentration of $GeO_2$ as reported in the literature are:

$a_i^{core}$={0.4921,0.6292,0.5920}

$b_i^{core}$={0.0481,0.1128,8.2930}

$a_i^{clad}$={0.6774,0.4010,0.8719}

$b_i^{clad}$={0.0614,0.1203,9.8563}

Figure 3:
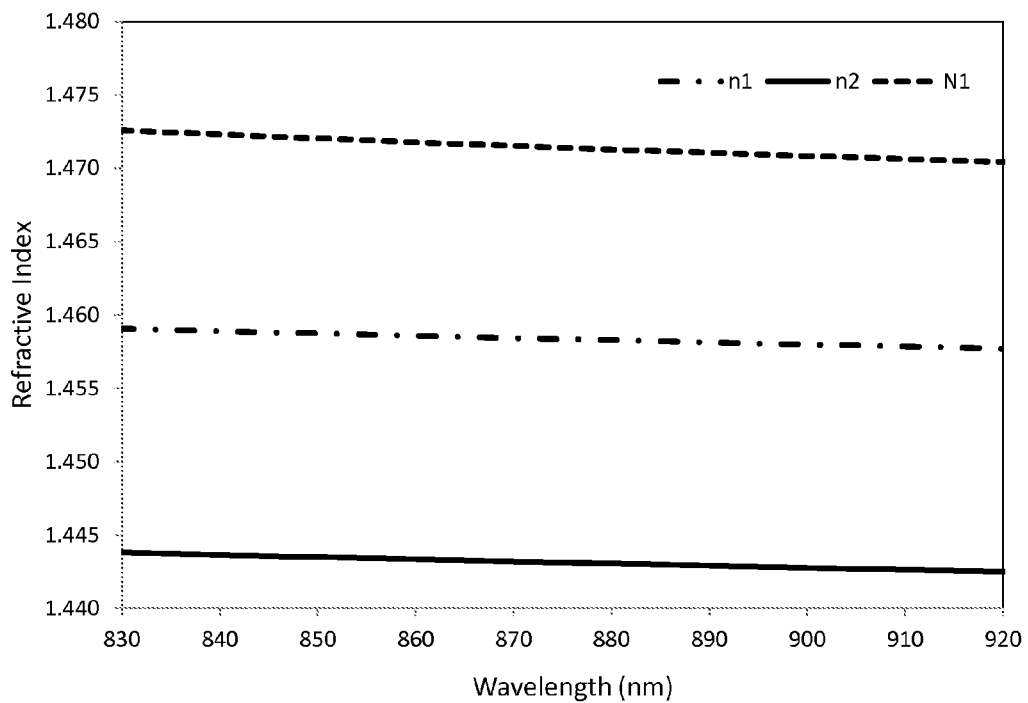
FIG. 3 illustrates core refractive index (n1), clad refractive index (n2) and group index N1.
Figure 4:
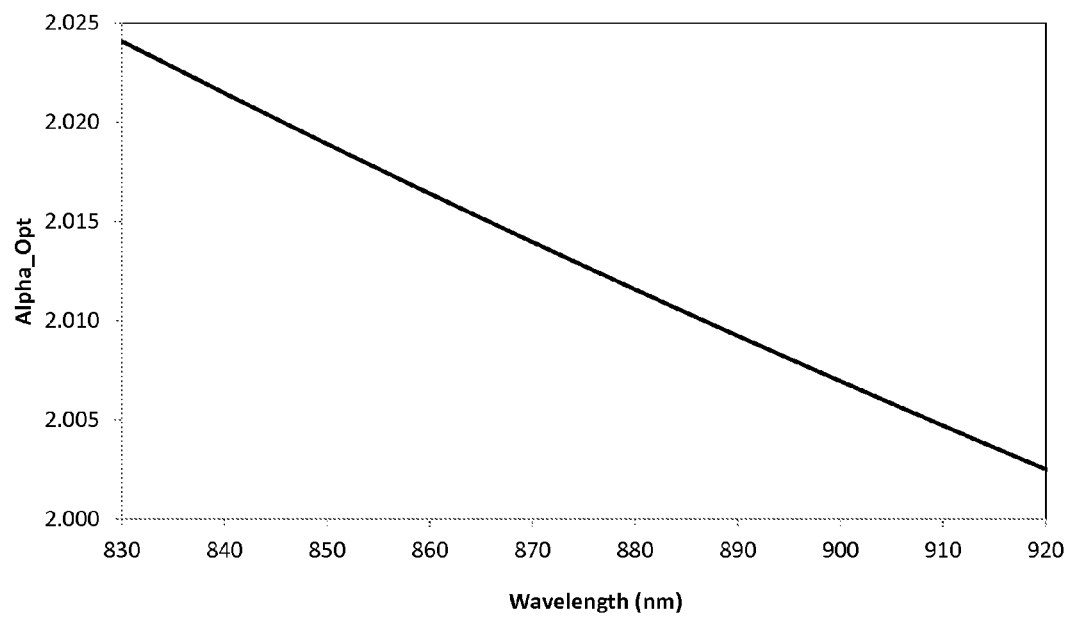
FIG. 4 illustrates alpha optimum as a function of the wavelengths for the parameters used in the exemplary.
Figure 5:
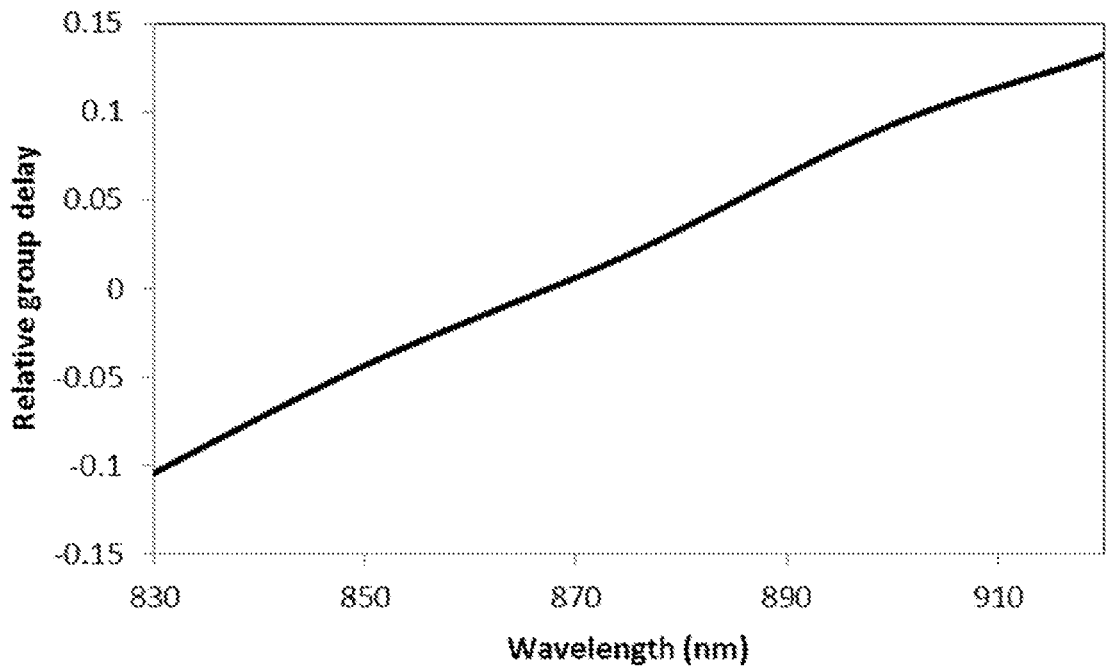
FIG. 5 illustrates relative group delays as a function of wavelength calculated in accordance with an embodiment of the present invention.

Using equation (23) it is possible to obtain the wavelength dependent refractive index on the axis of the fiber core ($n_1$), in the cladding ($n_2$), and the group index ($N_1$) as shown in FIG. 3. From equation (5) $\alpha_{opt}$ as a function of the wavelength is obtained, and the results are shown in FIG. 4. In the currently described example, the initial arbitrary value for $\alpha$ selected in step 105 is 2.012. Next, in step 110 the relative group delays $t_g$ and the DMD pulses are obtained using equation (4) for all the wavelengths of interest. The maximum relative group delays, defined as the difference between the group delays of the higher-order modes and the lower-order modes are computed. For the parameters shown in this example, the maximum relative group delay as a function of the wavelength is given in FIG. 5. It can be noted from this figure that the relative group delays are negative below 870 nm. As such, when the fiber of the currently described embodiment is operating at wavelengths below 870 nm, said fiber may provide modal-chromatic dispersion compensation. Alternatively, in this step the refractive index profile can be computed using equation (1).

Next, in step 115 a set of VCSELs are modeled. Preferably, this is a relatively large set sufficient to establish results associated with a broad range of VCSELs. For the modeling described in the current example, 500 VCSELs with parameters similar to the 10 representative VCSELs used in the DMD standard test method (TIA FOTP 220) are utilized. The total number of VCSELs (10×500=5000) is used to simulate the coupling from the laser to the MMF. The VCSEL spectrum can be represented by equation (6).

The spectral width of the VCSELs, which is an important parameter that influences the chromatic dispersion penalty, can be computed using:

$$\Delta\lambda = \sqrt{\frac{\int P(\lambda)(\lambda - \lambda_{mean})^2 d\lambda}{\int P(\lambda) d\lambda}} \quad (25)$$

$$\lambda_{mean} = \frac{\int P(\lambda)\lambda d\lambda}{\int P(\lambda) d\lambda} \quad (26)$$

Figure 6:
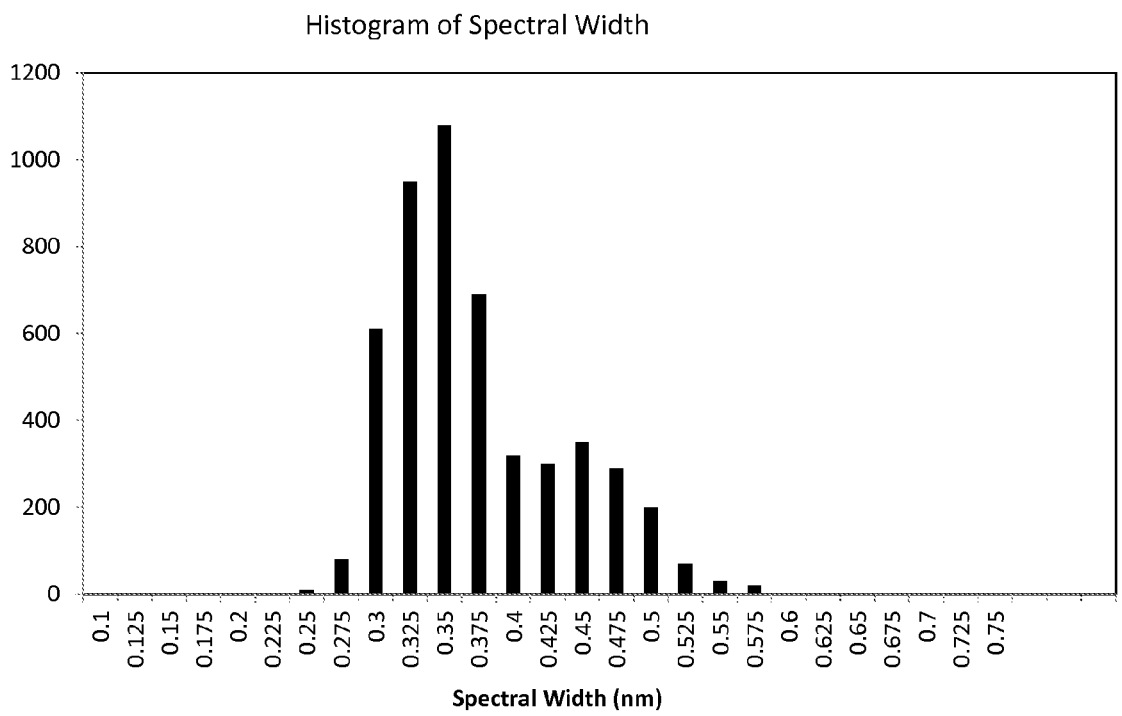
FIG. 6 illustrates a spectral width histogram for the utilized VCSEL.

The histogram for the RMS spectral width of the 5000 VCSELs utilized in this example is shown in FIG. 6. Then the coupling coefficient for the MMF and VCSEL modes, $C_{gi}$ are obtained from the square sum of the normalized overlap integral of each $i^{th}$ VCSEL mode and all the fiber modes belonging to the $g^{th}$ MG. The $C_{gi}$ matrix was used to obtain the spectra of each MMF mode group, $PG_g$, using equations (7-8).

Due to the wide range of the 5000 VCSEL center wavelengths utilized in this example it may be useful to describe the mode spectral bias of the VCSEL population. Using equation (9) the spectral bias $\Delta\lambda_g$ is computed to be <0.3 nm.

Figure 7:
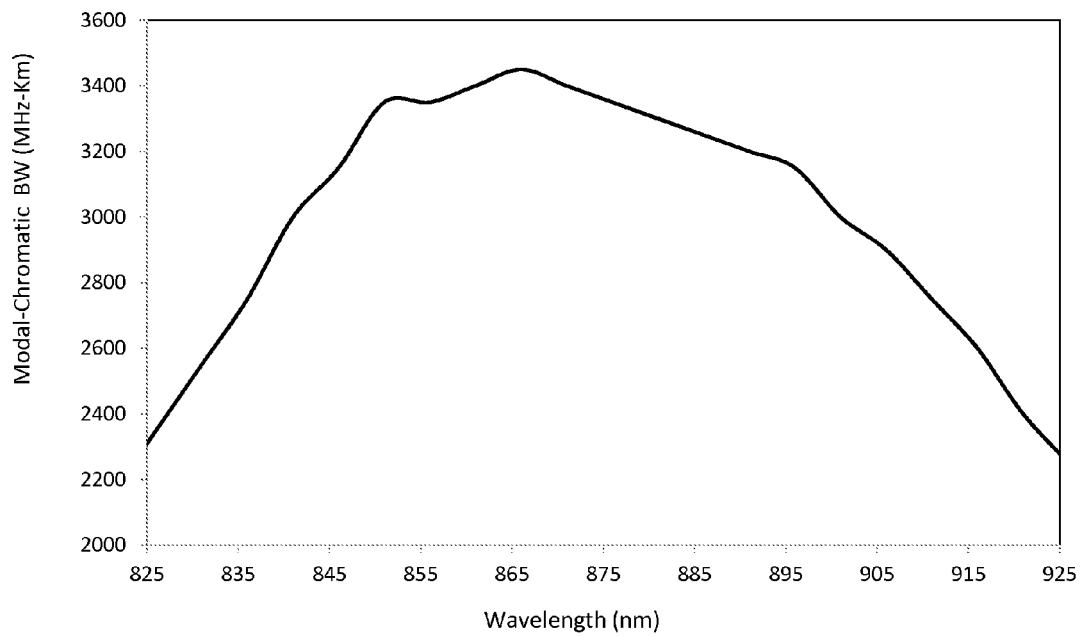
FIG. 7 illustrates 1% worst case Modal-Chromatic Bandwidth for the example.

The total channel dispersion is a result of the different propagation speed of each of the modes (modal dispersion) and the material or chromatic dispersion computed in step 115. The transfer function that represents the total dispersion in the optical channel is computed using equation (12). The 3 dB bandwidth of these transfer functions are obtained for each of the VCSELs and for all the wavelengths of interest (in this case from 830 nm to 920 nm) as shown in FIG. 7.

These bandwidth values can now be used to estimate the channel reach for a data center or enterprise local area network application. According to an embodiment of the present invention, the reach for a given application is computed in step 120. Depending on the application, the reach requirements are defined in standards bodies such as IEEE 802.3 Ethernet (802.3 ae, 802.3 ba, or 802.3 bm . . . ) or T11 Fibre Channel (i.e PI-4, PI-5, PI-6 . . . ). Traditionally, the reach is computed using a link model implemented in an Excel spreadsheet. The link model inputs for the VCSEL transmitter and receivers include the optical modulation amplitude (OMA), receiver sensitivity, transmitter jitter, relative intensity noise, mode partition noise, and extinction ratio among others. The parameters related to the optical channel itself are modal and chromatic dispersion, and attenuation. Presently, the modal and chromatic dispersions are separate inputs to the IEEE and Fibre Channel link models which adds them in a quadratic form:

$$\text{BW\_optical\_channel} = (\text{Modal\_BW}^{-2} + \text{Chromatic\_BW}^{-2})^{-0.5} \quad (27)$$

While equation (27) may provide some estimation, to execute these more complex computations, the calculation may be implemented using a higher-level programming language or application such as, for example, MatLab that can interface with our method and perform the required algorithms. For the present example, steps 100-140 have been implemented in MatLab.

Figure 8:
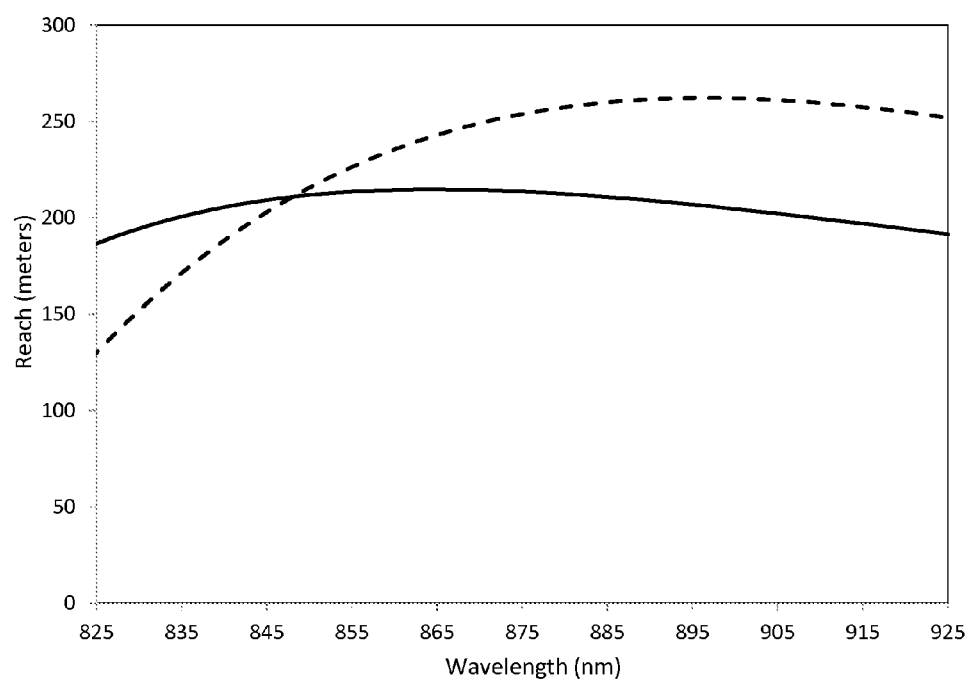
FIG. 8 illustrates reaches as a function of wavelength calculated in accordance with an embodiment of the present invention.
Figure 9:
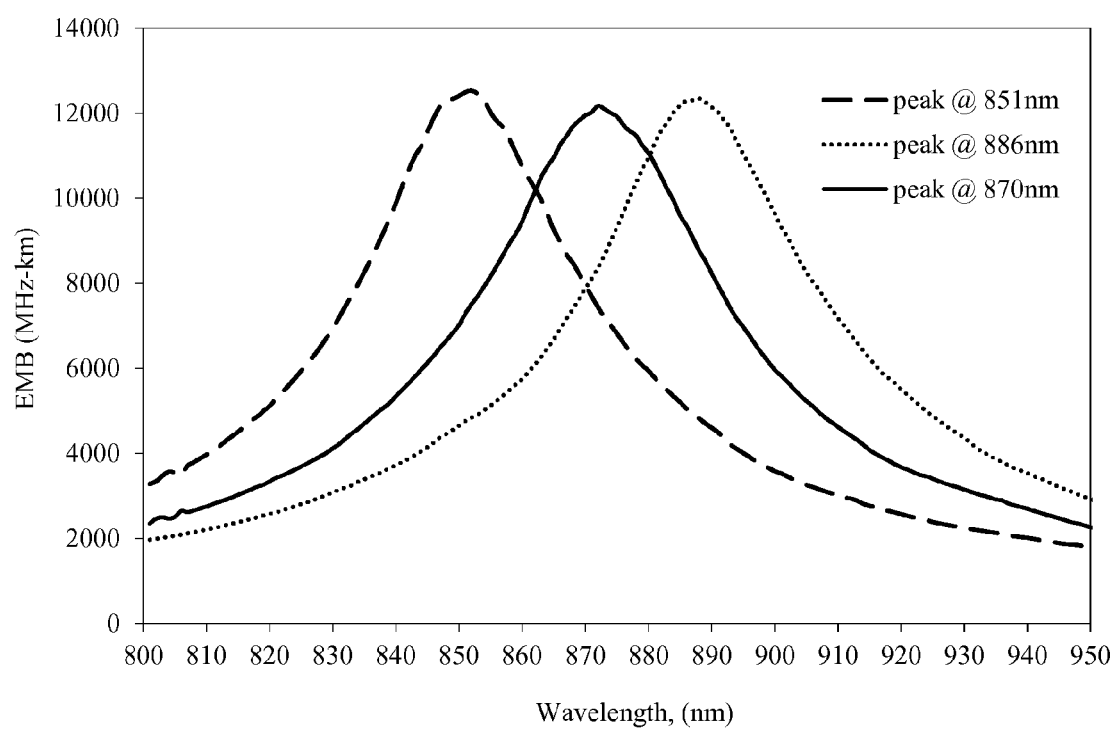
FIG. 9 illustrates a plot of the optimized peak wavelengths and wavelength dependence for three MMFs.

To demonstrate the method for achieving maximum channel reach for a dual-wavelength transmission system as described in this embodiment, the following input parameters are considered. The transmission data rate is 20 Gbps, the maximum bit error rate is 1e-12, the minimum OMA is −1.5 dBm, and the minimum receiver sensitivity is −7.5 dBm. The wavelength dependent modal-chromatic bandwidth is obtained from FIG. 7. Using these inputs, the result of the first iteration in this step 120 is shown in FIG. 8 via a dashed line. During the first iteration, the reaches $R_1$ and $R_2$ for the desired wavelength 830 and 920 nm are evaluated in step 125. Since $R_1$ is different than $R_2$ the process proceeds to step 130. If $R_1 > R_2$ the value of alpha is decreased 135, otherwise alpha is increased 140. This method is repeated until $R_1$ is equal to $R_2$ or the difference between them is acceptable for the application. The solid line in FIG. 8 shows the final optimized result with a tolerance in accuracy of <5%. In this exemplary case, the EMB for the optimized wavelength of 870 nm, shown in FIG. 9.

Since the reach of many high-speed MMF channel links are chromatic dispersion limited, additional performance benefit may be obtained by modifying the core material systems for a shorter zero-dispersion wavelength.

I should be understood that design techniques described herein may be combined with any known fiber manufacturing techniques to the extent necessary. For example, those of ordinary skill will be familiar with the general concept of manufacturing optical fibers where in a first stage a preform is produced and in a second stage a fiber is drawn from that preform. Those familiar with the relevant art will also be familiar with the techniques used to introduce/add one or more dopants during the manufacturing stages. This step typically occurs during the preform formation stage where a controlled introduction of dopants results in a preform having some desired dopant concentration profile. In some embodiments, it is at this stage that the selected dopants can be controlled in accordance with the design parameters of the present invention.

Note that while this invention has been described in terms of one or more embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. It should also be noted that there are many alternative ways of implementing the methods and apparatuses of the present invention. For example, while extensive references have been made to VCSEL systems throughout the specification, the present invention may be implemented with other, non-VCSEL optical sources. It is therefore intended that claims that may follow be interpreted as including all such alterations, permutations, and equivalents as fall within the true spirit and scope of the present invention.

Furthermore, the subject matter described herein, such as for example the methods for designing and/or manufacturing an MMF in accordance with the present invention, can be implemented at least partially in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps of a method or process. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms. Devices embodying the subject matter described herein may be manufactured by any means, such as by semiconductor fabrication or discreet component assembly although other types of manufacturer are also acceptable, and can be manufactured of any material, e.g., CMOS.

REFERENCES

The following references are incorporated herein in their entirety:
  R. Pimpinella, J. Castro, B/Kose, and B. Lane, "Dispersion Compensated Multimode Fiber," Proceeding of the 60th IWCS 2011.
  J. Castro, R. Pimpinella, B. Kose, and B. Lane, "Investigation of the Interaction of Modal and Chromatic Dispersion in VCSEL-MMF Channels," IEEE OSA JLT, 30(15), pp. 2532-2541.
  TIA-455-220-A, "DMD Measurement of Multimode Fiber in the Time Domain," January 2003.
  IEC 60793-1-49, "Measurement methods and test procedures—Differential Mode Delay."

We claim:
1. A method for manufacturing a multimode optical fiber (MMF) optimized for operation within a plurality of operating wavelengths, said MMF having a core with a refractive index profile defined by

$$n(r) = n_1 \sqrt{1 - 2\Delta \left(\frac{r}{a}\right)^\alpha}$$

where:
  $n_1$ is a refractive index at a center of said core;
  r is a radius of said core;
  α is a parameter defining a shape of the refractive index profile;
  $\Delta = (n_1 - n_2)/n_1$; and
  $n_1$ is a refractive index of said core at r=a, said method comprising the steps of:
(a) obtaining at least one parameter associated with at least one of a transceiver and said MMF;
(b) for each of said plurality of operating wavelengths, determining an $\alpha_{opt}$ value using said at least one parameter, where for each of said plurality of operating wavelengths said respective $\alpha_{opt}$ value minimizes a group delay of said MMF when said $\alpha$ is set equal to said $\alpha_{opt}$;
(c) based on said plurality of $\alpha_{opt}$ values, selecting a single $\alpha_{temp}$ value;
(d) for each of said plurality of operating wavelengths, computing a differential mode delay (DMD) plot and a relative group delay $t_g$ by using said single $\alpha_{temp}$ value;
(e) for each of said plurality of operating wavelengths, computing a modal-chromatic bandwidth by using said respective DMD plot;
(f) for each of said plurality of operating wavelengths, calculating a maximum channel reach value by using said respective modal-chromatic bandwidth;
(g) adjusting said single $\alpha_{temp}$ value when said maximum channel reach values are not equal and repeating steps (d)-(g);
(h) setting said $\alpha$ to said adjusted single $\alpha_{temp}$ value; and
(i) producing said MMF.

2. A method for manufacturing a multimode optical fiber (MMF) optimized for operation between a first operating wavelength and a second operating wavelength, said MMF having a core with a refractive index profile defined by $$n(r) = n_1 \sqrt{1 - 2\Delta\left(\frac{r}{a}\right)^a}$$

where:
$n_1$ is a refractive index at a center of said core;
r is a radius of said core;
$\alpha$ is a parameter defining a shape of the refractive index profile;
$\Delta = (n_1 - n_2)/n_1$; and
$n_1$ is a refractive index of said core at r=a,
said method comprising the steps of:
(a) obtaining at least one parameter associated with at least one of a transceiver and said MMF;
(b) for said first operating wavelength, determining an $\alpha_{opt1}$ value using said at least one parameter, where for said first operating wavelength said $\alpha_{opt1}$ value minimizes a group delay of said MMF when said $\alpha$ is set equal to said $\alpha_{opt1}$;
(c) for said second operating wavelength, determining an $\alpha_{opt2}$ value using said at least one parameter, where for said second operating wavelength said $\alpha_{opt2}$ value minimizes said group delay of said MMF when said $\alpha$ is set equal to said $\alpha_{opt2}$;
(d) based on said $\alpha_{opt1}$ value and said $\alpha_{opt2}$ value, selecting an $\alpha_{temp}$ value;
(e) for each of said first and second operating wavelengths, computing a differential mode delay (DMD) plot and a relative group delay $t_g$ by using said $\alpha_{temp}$ value;
(f) for each of said first and second operating wavelengths, computing a modal-chromatic bandwidth by using said respective DMD plot;
(g) for each of said first and second operating wavelengths, calculating a maximum channel reach value by using said respective modal-chromatic bandwidth, where for said first operating wavelength said respective maximum channel reach value is R1 and for said second operating wavelength said respective maximum channel reach value is R2;
(h) adjusting said $\alpha_{temp}$ value when R1≠R2 such that $\alpha_{temp} = \alpha_{temp} \pm x$, and repeating steps (e)-(h);
(i) setting said $\alpha$ to said $\alpha_{temp}$ value when R1=R2; and
(j) producing said MMF.

3. The method of claim 2, wherein in step (h) when R1>R2 said $\alpha_{temp}$ value is adjusted such that $\alpha_{temp} = \alpha_{temp} + x$, and when R1<R2 said $\alpha_{temp}$ value is adjusted such that $\alpha_{temp} = \alpha_{temp} - x$.

4. The method of claim 2, wherein said first operating wavelength is 850 nm±10 nm and said second operating wavelength is 1300 nm±10 nm.

5. The method of claim 2, wherein in step (d) said $\alpha_{temp} = (\alpha_{opt1} + \alpha_{opt2})/2$.

6. A multimode optical fiber optimized for VCSEL based communication systems having at least two transmission wavelengths, said VCSEL based communication systems causing modal and chromatic dispersion interaction resulting from spatial spectral coupling of VCSEL modes to optical fiber modes, said multimode optical fiber comprising:
a cladding; and
a core with a refractive index profile characterized by a distribution of refractive indices from a center of said core to a radius of said core, said refractive index profile providing compensation for said modal and chromatic dispersion interaction, said core further having a peak optimized wavelength comprised of a collective modal and chromatic bandwidth at a shortest transmission wavelength and a longest transmission wavelength such that a first channel reach at said shortest transmission wavelength and a second channel reach at said longest transmission wavelength are equal.

7. The multimode optical fiber of claim 6, wherein said shortest transmission wavelength is 850 nm±10 nm and said longest transmission wavelength is 1300 nm±10 nm.

8. The multimode optical fiber of claim 6, wherein said fiber supports bi-directional transmission.

9. The multimode optical fiber of claim 6, where a zero dispersion wavelength is shifted to a wavelength less than 1300 nm.

10. A method for manufacturing a multimode optical fiber (MMF) optimized for operation between a first operating wavelength $\lambda_1$ and a second operating wavelength $\lambda_2$, said MMF having a core with a refractive index profile with an $\alpha$-parameter, said method comprising the steps of:
(a) obtaining at least one parameter associated with at least one of a transceiver and said MMF;
(b) for said $\lambda_1$, determining an $\alpha_{opt1}$ value using said at least one parameter, where for said $\lambda_1$ said $\alpha_{opt1}$ value minimizes a group delay of said MMF when said $\alpha_{opt1}$ used as said $\alpha$-parameter of said refractive index profile;
(c) for said $\lambda_2$, determining an $\alpha_{opt2}$ value using said at least one parameter, where for said $\lambda_2$ said $\alpha_{opt2}$ value minimizes said group delay of said MMF when said $\alpha_{opt2}$ used as said $\alpha$-parameter of said refractive index profile;
(d) based on said $\alpha_{opt1}$ value and said $\alpha_{opt2}$ value, selecting an $\alpha_{temp}$ value;
(e) for each of said $\lambda_1$ and said $\lambda_2$, computing a differential mode delay (DMD) plot and an effective modal bandwidth by using said $\alpha_{temp}$ value;
(f) for each of said DMD plots, correcting a temporal centroid of each mode-group impulse in said respective DMD plot to account for modal-chromatic dispersion;
(g) for each of said $\lambda_1$ and said $\lambda_2$, calculating a modal-chromatic bandwidth;

(h) for said $\lambda_1$, using said respective modal-chromatic bandwidth to calculate a maximum channel reach R1;

(i) for said $\lambda_2$, using said respective modal-chromatic bandwidth to calculate a maximum channel reach R2;

(j) adjusting said $\alpha_{temp}$ value when R1≠R2 such that $\alpha_{temp}=\alpha_{temp}\pm x$, and repeating steps (e)-(j); and (k) producing said MMF with said refractive index profile defined by said $\alpha$-parameter being equal to $\alpha_{temp}$ value when R1=R2.

11. The method of claim 10, wherein in step (j) when R1>R2 said $\alpha_{temp}$ value is adjusted such that $\alpha_{temp}=\alpha_{temp}+x$, and when R1<R2 said $\alpha_{temp}$ value is adjusted such that $\alpha_{temp}=\alpha_{temp}-x$.

12. The method of claim 10, wherein said $\lambda_1$ is 850 nm±10 nm and said $\lambda_2$ is 1300 nm±10 nm.

13. The method of claim 10, wherein in step (d) said $\alpha_{temp}=(\alpha_{opt1}+\alpha_{opt2})/2$.

* * * * *